(12) United States Patent
Hoilien

(10) Patent No.: US 11,264,496 B2
(45) Date of Patent: Mar. 1, 2022

(54) TRANSISTOR WITH BURIED P-FIELD TERMINATION REGION

(71) Applicant: Polar Semiconductor, LLC, Bloomington, MN (US)

(72) Inventor: Noel Hoilien, Minneapolis, MN (US)

(73) Assignee: Polar Semiconductor, LLC, Bloomington, MN (US)

(*) Notice: Subject to any disclaimer, the term of this patent is extended or adjusted under 35 U.S.C. 154(b) by 0 days.

(21) Appl. No.: 16/853,072

(22) Filed: Apr. 20, 2020

(65) Prior Publication Data

US 2021/0328054 A1 Oct. 21, 2021

(51) Int. Cl.
*H01L 29/00* (2006.01)
*H01L 29/78* (2006.01)
*H01L 21/02* (2006.01)
*H01L 29/66* (2006.01)

(52) U.S. Cl.
CPC .... *H01L 29/7813* (2013.01); *H01L 21/02129* (2013.01); *H01L 21/02293* (2013.01); *H01L 29/66734* (2013.01); *H01L 29/7811* (2013.01)

(58) Field of Classification Search
None
See application file for complete search history.

(56) References Cited

U.S. PATENT DOCUMENTS

| 2009/0250705 | A1* | 10/2009 | Watanabe | H01L 29/66068 257/77 |
| 2014/0284625 | A1* | 9/2014 | Kagotoshi | H01L 29/42316 257/77 |
| 2016/0087045 | A1* | 3/2016 | Shimizu | H01L 29/7813 257/77 |
| 2019/0035927 | A1* | 1/2019 | Iwaya | H01L 29/0638 |

\* cited by examiner

*Primary Examiner* — Reema Patel
(74) *Attorney, Agent, or Firm* — Daly, Crowley, Mofford & Durkee, LLP

(57) ABSTRACT

In one aspect, a method of fabricating a transistor includes depositing a first epitaxial layer, depositing a second epitaxial layer on the first epitaxial layer, implanting the second epitaxial layer to form a p-field termination region, depositing a third epitaxial layer on the p-field termination layer and forming trenches in the third epitaxial layer. The trenches include a trench gate of the transistor and a termination trench.

11 Claims, 4 Drawing Sheets

TRANSISTOR WITH BURIED P-FIELD TERMINATION REGION

BACKGROUND

An insulated-gate bipolar transistor (IGBT) is a three-terminal power semiconductor device. Typically, the IGBT is used as a switch in high-voltage applications. Compared to a power bipolar junction transistor (BJT) or a power metal-oxide-semiconductor field-effect transistor (MOSFET), the IGBT has a higher voltage rating and a higher current rating. Compared to a MOSFET, the IGBT has a higher switching frequency.

SUMMARY

In one aspect, a method of fabricating a transistor includes depositing a first epitaxial layer, depositing a second epitaxial layer on the first epitaxial layer, implanting the second epitaxial layer to form a p-field termination region, depositing a third epitaxial layer on the p-field termination layer and forming trenches in the third epitaxial layer. The trenches include a trench gate of the transistor and a termination trench.

In another aspect, a transistor includes a first epitaxial layer, a second epitaxial layer on the first epitaxial layer, a p-field termination region in the second epitaxial layer, a third epitaxial layer on the p-field termination layer and trenches in the third epitaxial layer. The trenches include a trench gate of the transistor and a termination trench.

In a further aspect, an insulated-gate bipolar junction transistor (IGBT) includes a P+ doped substrate, a first epitaxial layer having a first n-type dopant and disposed on the P+ doped substrate, a second epitaxial layer having a second n-type dopant and disposed on the first epitaxial layer, a p-field termination region in the second epitaxial layer, a third epitaxial layer having a third n-type doping and disposed on the p-field termination layer and trenches in the third epitaxial layer. The trenches include a trench gate of the IGBT and a termination trench.

The P+ doped substrate is a collector of the IGBT.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a transistor with a buried p-field termination region. In one example, the transistor is a trench insulated-gate bipolar transistor (IGBT). The techniques herein enable the fabrication of transistors that have a termination breakdown voltage (BV) that is more robust than traditional techniques. For example, a robust breakdown voltage means there is a minimal decrease in breakdown voltage across the expected amount of process variation. It can be measured electrically by comparing BV of IGBTs fabricated under nominal process conditions and "extreme" process conditions. The techniques described herein also may provide for transistors that have a BV mechanism that is more reliable than traditional techniques. For example, breakdown reliability may be measured by repeated breakdown measurements and/or stressing devices at a voltage near the breakdown voltage. The techniques described herein eliminate a diffusion step used in traditional transistor fabrication that requires a longer fabrication time, requires hotter temperatures and is more difficult to accomplish reliably.

Figure 1:
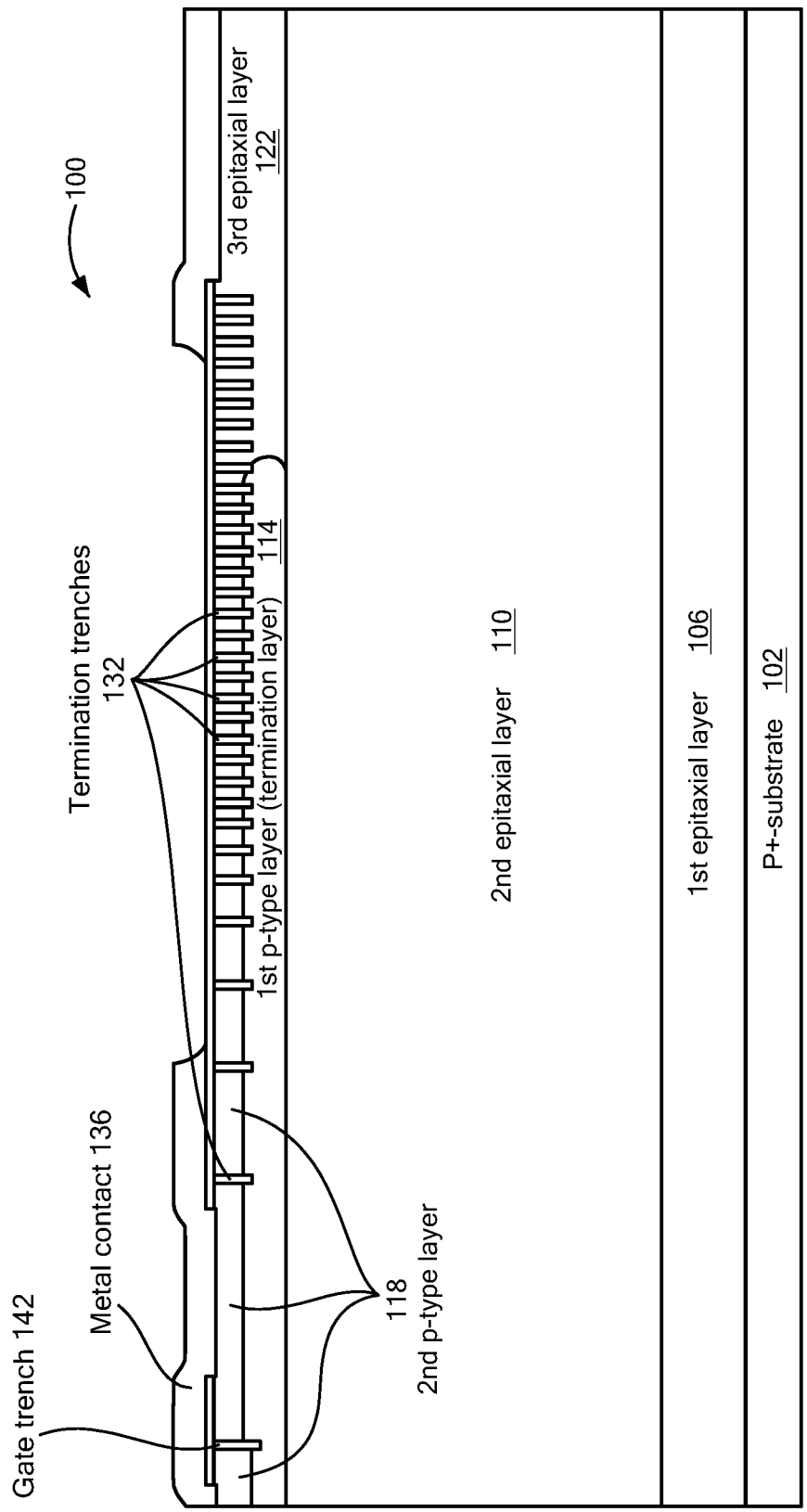
FIG. 1 is a diagram of an example of a transistor with a buried p-field termination region.

Referring to FIG. 1, a transistor 100 (e.g., IGBT) includes a P+-substrate 102, a first epitaxial layer 106 on the P+-substrate 102, a second epitaxial layer 110 on the first epitaxial layer 106 and a third epitaxial layer 122 on the second epitaxial 110. The P+-substrate 102 is a collector of the transistor 100.

The transistor 100 also includes a first p-type layer 114 that is formed through ion implantation in to the second epitaxial layer 110. The first p-type layer 114 is a p-field termination region. The p-field termination region is a termination region of the transistor 100 having p-type doped silicon. The termination region is at the perimeter of the die where electric fields are both vertical and horizontal, not just vertical as in the main cell (not shown) of the IGBT that includes a majority of the die area inside the termination.

The third epitaxial layer 122 includes termination trenches 132 and is connected to a metal contact 136 thereby connecting the source/base of the transistor 100 to the metal contact 136. The purpose of the termination trenches is to manage the horizontal electric field at the die perimeter to ensure the termination breakdown voltage exceeds the main cell breakdown voltage. In one example, there are 30 termination trenches 132.

A second p-type layer 118, formed through ion implantation, is in the third epitaxial layer 122 and in contact with the first p-type layer 114. The second p-type layer 118 is used as a base region for the transistor 100. A gate trench 142 extends within the second p-type layer connecting the first p-type layer 114 to a metal contact 136 thereby connecting the base of the transistor to the metal contact 136. In one example, the gate trench 142 turns the IGBT 100 on and off. In one example, there may be more gate trenches than the gate trench 142 depicted in FIG. 1.

Figure 2:
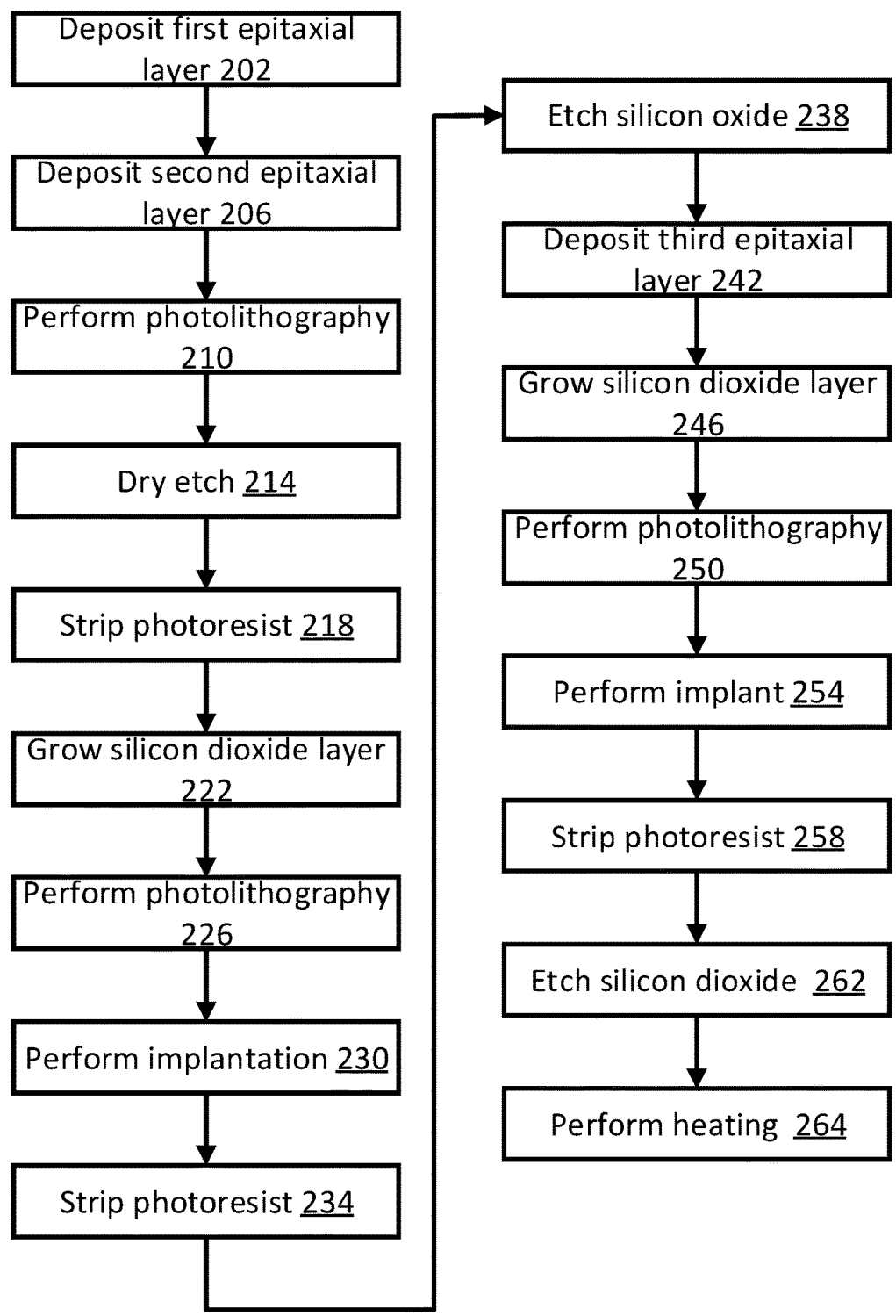
FIG. 2 is a flowchart of an example of a process to fabricate the buried p-field termination region.

Referring to FIG. 2, an example of a process to form the p-field termination region is a process 200. In one example, the transistor may be the transistor 100 shown in FIG. 1.

Process 200 deposits a first epitaxial layer (202). For example, the first epitaxial layer 106 is deposited on the P+-substrate 102 (FIG. 1). In one example, an epitaxial layer is grown having a thickness of about 8 microns. In one example, the first epitaxial layer includes phosphorous as a doping material and has a resistivity of about 0.050 Ohm-cm.

Process 200 deposits a second epitaxial layer (206). For example, the second epitaxial layer 110 is deposited on the first epitaxial layer 106 (FIG. 1). In one example, an epitaxial layer is grown having a thickness of about 58 microns. In one example, the second epitaxial layer includes phosphorous as a doping material and has a resistivity of about 33 Ohm-cm.

Process 200 performs photolithography (210). For example, a photoresist is applied to the second epitaxial layer 110 and additional photolithographical steps are performed to remove portions of the photoresist exposing one or more portions the second epitaxial layer 110 (FIG. 1).

Process 200 dry etches (214). For example, the one or more exposed portions of the second epitaxial layer 110 are removed using a dry etching process. In one example, processing block 214 enables the formation of alignment marks to which subsequent photolithography processing will align.

Process 200 strips the photoresist (218). For example, the photoresist applied in processing block 210 is removed.

Process 200 grows a silicon dioxide layer (222). For example, a silicon dioxide layer is grown on the second epitaxial layer 110 (FIG. 1). In one example, the silicon dioxide layer is about 500 Angstroms thick.

Process 200 performs photolithography (226). For example, a photoresist is applied to the silicon dioxide layer formed in processing block 222 and additional photolithographical steps are performed to remove portions of the photoresist exposing one or more portions of the silicon dioxide layer.

Process 200 performs implantation (230). For example, a doping material is implanted through the one or more exposed portions of the silicon dioxide layer into the second epitaxial layer 110 (FIG. 1). The implantation into the second epitaxial layer 110 forms the first p-type layer 114, which is the p-field termination region. In one particular example, the doping material is boron. In one example, the peak doping of the boron is about $5\times10^{15}/cm^3$. In some examples, the implantation is formed using ion implantation of at least 70 keV. In some examples, the ion implantation has a dosing of at least $3.2\times10^{12}$ ions/cm$^2$. In some example, the dosing ions (e.g., boron ions) are implanted at an angle of at least 7 degrees.

In one example, the processing block 230 may enable the breakdown voltage of the termination region of the transistor to be more robust against process variations than traditional techniques. In another example, the processing block 230 may enable that, at the breakdown voltage, the current flow mechanism causes less degradation to the transistor.

Figure 2A:
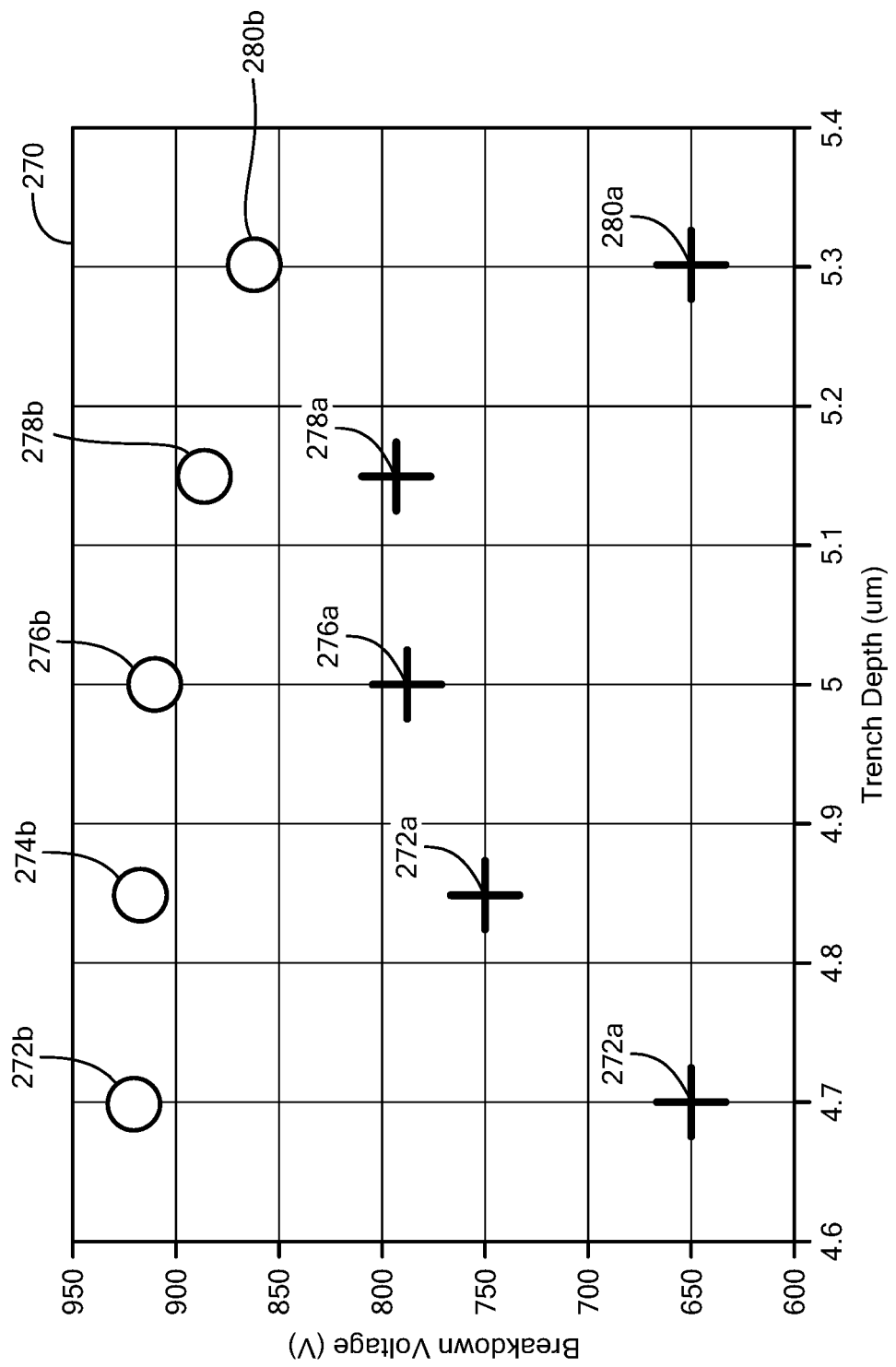
FIG. 2A is a graph of an example of breakdown voltage versus trench depth.

Referring to FIG. 2A, the processing block 230 enables the breakdown voltage to be significantly higher than traditional approaches, and the breakdown voltage changes less with changes in trench depth using process block 230 than using traditional approaches as depicted in a graph 270. For example, at a trench depth of 4.7 microns, the traditional techniques would have a breakdown voltage of 650 V (272a), but using the processing block 230, the breakdown voltage would be about 925 V (272b); at a trench depth of 4.85 microns, the traditional techniques would have a breakdown voltage of 750 V (274a), but using the processing block 230, the breakdown voltage would be about 925 V (274b); at a trench depth of 5.0 microns, the traditional techniques would have a breakdown voltage of 790 V (276a), but using the processing block 230, the breakdown voltage would be about 910 V (276b); at a trench depth of 5.15 microns, the traditional techniques would have a breakdown voltage of 795 V (278a), but using the processing block 230, the breakdown voltage would be about 880 V (278b); and at a trench depth of 5.3 microns, the traditional techniques would have a breakdown voltage of 650 V (280a), but using the processing block 230, the breakdown voltage would be about 855 V (280b).

Referring back to FIG. 2, process 200 strips the photoresist (234). For example, the photoresist applied in processing block 226 is removed.

Process 200 etches the silicon dioxide layer (238). For example, the silicon dioxide layer is removed using a wet etching technique. In one example, all of the silicon dioxide is removed.

In one particular example, the processing blocks 234, 238 may be combined. For example, an integrated etching may be performed that removes both the silicon dioxide and the photoresist using a wet etching technique.

Process 200 deposits a third epitaxial layer (242). For example, the third epitaxial layer 122 is deposited on the second epitaxial layer 110 (FIG. 1). In one example, an epitaxial layer is grown having a thickness of about 5 microns. In one example, the third epitaxial layer includes phosphorous as a doping material and has a resistivity of about 0.9 Ohm-cm.

Process 200 grows a silicon dioxide layer (246). For example, a silicon dioxide layer is grown on the third epitaxial layer 122 (FIG. 1). In one example, the silicon dioxide layer is about 500 Angstroms thick.

Process 200 performs photolithography (250). For example, a photoresist is applied to the silicon dioxide layer formed in processing block 246 and additional photolithographical steps are performed to remove portions of the photoresist exposing one or more portions of the silicon dioxide layer.

Process 200 performs implantation (254). For example, a doping material is implanted through the one or more exposed portions of the silicon dioxide layer into the third epitaxial layer 122 (FIG. 1). The implantation into the third epitaxial layer forms the second p-type layer 118, which is a base region. In one particular example, the doping material is boron. In one example, boron may be used at a peak doping level of about $2\times10^{17}/cm^3$. In some examples, the ion implantation is formed using ion implantation of at least 70 keV. In some examples, the implantation has a dosing of at least $8.0\times10^{13}$ ions/cm$^2$.

Process 200 strips the photoresist (258). For example, the photoresist applied in processing block 250 is removed.

Process 200 etches the silicon dioxide layer (262). For example, the silicon dioxide layer is removed using a wet etching technique. In one example, all of the silicon dioxide is removed.

In one particular example, the processing blocks 258, 262 may be combined. For example, an integrated etching may be performed that removes both the silicon dioxide and the photoresist using a wet etching technique.

Process 200 performs heating (264). For example, the second p-type layer 118 is heated to further drive the doping material into the third epitaxial layer 122 (FIG. 1). For example, the second p-type layer 118 is heated to 1150° C. for more than 5 hours giving the second p-type layer 118 a thickness of about 4500 Angstroms.

Figure 3:
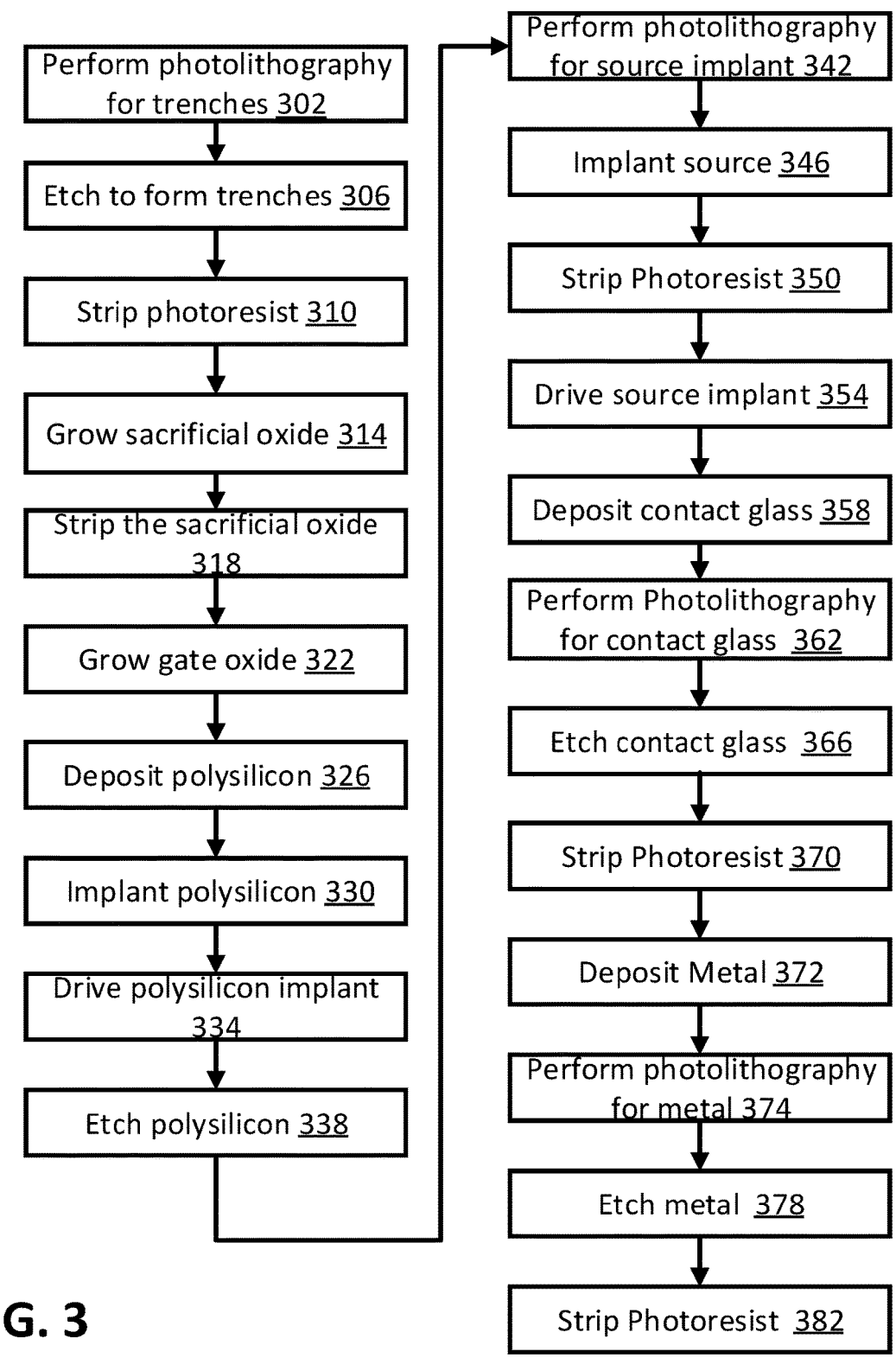
FIG. 3 is a flowchart of an example of a process to complete fabrication of the transistor in FIG. 1 after the process of FIG. 2.

Referring to FIG. 3, an example of a process to complete fabrication of a transistor (e.g., the transistor 100 in FIG. 1) after the process of FIG. 2 is a process 300. One of ordinary skill in the art would recognize that other processes may be used than the process 300 to fabricate a transistor with a buried p-field termination region.

Process 300 performs photolithography for trenches (302). For example, a photoresist is applied to the third silicon epitaxial layer 122 and additional photolithographical steps are performed to remove portions of the photoresist exposing one or more portions of the third silicon epitaxial layer 122.

Process 300 etches to form the trenches (306). For example, the one or more exposed portions of the third epitaxial layer 122 are removed to form trenches using a dry or wet etching process to form the trenches. For example, the gate trench 142 and the termination trenches 132 are formed.

Process 300 strips the photoresist (310). For example, the photoresist applied in processing block 302 is removed.

Process 300 grows sacrificial oxide (314). For example, a 1500 Angstrom oxide layer is grown by wet oxidation at a 1000° C.

Process 300 strips the sacrificial oxide (318). For example, wet etching techniques are used to remove the sacrificial oxide. In one example, all of the sacrificial oxide is removed.

Process 300 grows gate oxide (322). For example, a gate oxide that is 1000 Angstroms thick is grown using wet oxidation techniques at 900° C.

Process 300 deposits polysilicon (326). For example, a 15,000 Angstrom thick layer of polysilicon is deposited using low pressure chemical vapor deposition (LPCVD) on the gate oxide.

Process 300 implants polysilicon (330). For example, a doping material is implanted through the one or more exposed portions of the silicon dioxide layer into the third epitaxial layer 122 (FIG. 1). In one example, the polysilicon is implanted with phosphorous. In one example, the phosphorous is implanted at 70 keV and at a doping level greater than $1 \times 10^{16}/cm^3$. Process 300 drives polysilicon implant (334). For example, the polysilicon is heated to 1100° C.

Process 300 etches the polysilicon (338). For example, the polysilicon may be etched using dry etching techniques. In one example, all of the polysilicon is removed except for polysilicon in the trenches (e.g., termination trenches 132 and gate trench 142).

Process 300 performs photolithography for source implant (342). For example, a photoresist is applied to the source and additional photolithographical steps are performed to remove portions of the photoresist exposing one or more portions of the source.

Process 300 implants source (346). For example, the exposed portions of the contact are implanted with arsenic. In one example, the arsenic is implanted at 140 keV and at a dosing level of about $2 \times 10^{15}/cm^2$.

Process 300 strips the photoresist (350). For example, the photoresist applied in processing block 342 is removed.

Process 300 drives source implant (354). For example, the contact is heated to 1100° C. for 30 minutes to drive the arsenic.

Process 300 deposits contact glass (358). For example, a 7000 Angstrom borophosphosilicate glass (BPSG) layer is added and a 3000 Angstrom undoped silane glass (USG) layer is added.

Process 300 performs photolithography for contact glass (362). For example, a photoresist is applied to the contact glass and additional photolithographical steps are performed to remove portions of the photoresist exposing one or more portions of the contact glass.

Process 300 etches the contact glass (366). For example, the one or more exposed portions of the contact glass may be etched using dry or wet etching techniques.

Process 300 strips the photoresist (370). For example, the photoresist applied in processing block 362 is removed.

Process 300 deposits a metal (372). For example, a layer of metal is deposited on the contact using, for example, sputtering techniques. In one example, the metal layer includes aluminum silicon.

Process 300 performs photolithography for the metal (374). For example, a photoresist is applied to the metal and additional photolithographical steps are performed to remove portions of the photoresist exposing one or more portions of the metal.

Process 300 etches metal (378). For example, the one or more exposed portions of the metal are etched using dry or wet etching techniques.

Process 300 strips the photoresist (382). For example, the photoresist applied in processing block 374 is removed.

The processes described herein are not limited to the specific examples described. For example, the processes 200 and 300 are not limited to the specific processing order of FIGS. 2 and 3, respectively. Rather, any of the processing blocks of FIGS. 2 and 3 may be re-ordered, combined or removed, performed in parallel or in serial, as necessary, to achieve the results set forth above.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method of fabricating a transistor, comprising:
depositing a first epitaxial layer having a n-type doping onto a doped substrate having a p+-type doping, wherein the doped substrate is a collector of the transistor;
depositing a second epitaxial layer having n-type doping on the first epitaxial layer;
implanting the second epitaxial layer to form a p-field termination region;
depositing a third epitaxial layer having n-type doping directly on the p-field termination region; and
forming trenches in the third epitaxial layer, wherein the trenches comprise a trench gate of the transistor and a termination trench.

2. The method of claim 1, further comprising, after depositing the third epitaxial layer, implanting the third epitaxial layer to form a base region.

3. The method of claim 2, wherein implanting the third epitaxial layer comprises implanting the third epitaxial layer with boron.

4. The method of claim 3, further comprising heating the base region to drive the boron further in to the third epitaxial layer.

5. The method of claim 4, wherein heating the base region comprises heating the base region to 1150° C. for more than 5 hours.

6. The method of claim 1, wherein implanting the second epitaxial layer to form the p-field termination region comprises implanting the second epitaxial layer with boron.

7. The method of claim 1, further comprising:
after depositing the second epitaxial layer, growing a silicon dioxide on the second epitaxial layer; and
implanting boron through the silicon dioxide into the second epitaxial layer.

8. The method of claim 7, further comprising:
after depositing the third epitaxial layer, growing a silicon dioxide on the second epitaxial layer; and implanting boron through the silicon dioxide into the third epitaxial layer.

9. The method of claim 1, wherein the termination trench extends through the third epitaxial layer and into and ends in the p-field termination region.

10. The method of claim 1, wherein the second epitaxial layer has a thickness greater than a thickness of the first epitaxial layer.

11. The method of claim 10, wherein the thickness of the second epitaxial layer is at least twice the thickness of the first epitaxial layer.

\* \* \* \* \*